(12) United States Patent  
Chien et al.

(10) Patent No.: US 9,377,495 B2  
(45) Date of Patent: Jun. 28, 2016

(54) WIRELESS TESTING SYSTEM AND METHOD FOR CONTROLLING THE SAME

(71) Applicants: LITE-ON ELECTRONICS (GUANGZHOU) LIMITED, Guangzhou (CN); LITE-ON TECHNOLOGY CORP., Taipei (TW)

(72) Inventors: Yu-Kun Chien, Taipei (TW); Ching-Wu Hsiao, Taipei (TW)

(73) Assignees: Lite-On Electronics (Guangzhou) Limited, Guangzhou (CN); Lite-On Technology Corp., Taipei (TW)

( * ) Notice: Subject to any disclaimer, the term of this patent is extended or adjusted under 35 U.S.C. 154(b) by 104 days.

(21) Appl. No.: 14/160,748

(22) Filed: Jan. 22, 2014

(65) Prior Publication Data

US 2014/0256267 A1    Sep. 11, 2014

(30) Foreign Application Priority Data

Mar. 6, 2013    (CN) .......................... 2013 1 0071558

(51) Int. Cl.
- *H04W 24/00* (2009.01)
- *H04B 17/00* (2015.01)
- *G01R 29/10* (2006.01)

(52) U.S. Cl.
CPC .............. *G01R 29/10* (2013.01); *G01R 29/105* (2013.01); *H04B 17/00* (2013.01)

(58) Field of Classification Search
CPC ....................................................... H04B 17/15
See application file for complete search history.

(56) References Cited

U.S. PATENT DOCUMENTS

| | | | |
|---|---|---|---|
| 2006/0194553 A1* | 8/2006 | Ozaki | G01R 29/10 455/226.1 |
| 2006/0232491 A1* | 10/2006 | Nakamura | 343/841 |
| 2008/0129615 A1* | 6/2008 | Breit | G01R 29/105 343/703 |
| 2010/0045543 A1* | 2/2010 | Kitada | 343/703 |
| 2010/0171669 A1* | 7/2010 | Ito | G01R 29/10 343/703 |
| 2013/0294252 A1* | 11/2013 | Olgaard et al. | 370/241 |

\* cited by examiner

*Primary Examiner* — Nay Maung  
*Assistant Examiner* — Cindy Trandai  
(74) *Attorney, Agent, or Firm* — Rosenberg, Klein & Lee

(57) ABSTRACT

A wireless testing system includes a main computer that controls a wireless module, a rotary mechanism, a measurement device, and an antenna. The rotary mechanism includes a rotatable seat controlled by the main computer to rotate about a first rotation axis, a support arm disposed on the rotatable seat, and a module rotating arm disposed on the support arm and positioning the wireless module at or in the vicinity of the first rotation axis. The module rotating arm is controlled by the main computer to rotate the wireless module about a second rotation axis. The antenna is substantially directed toward the wireless module. The measurement device is controlled by the main computer to control the antenna to receive or transmit a wireless signal.

12 Claims, 4 Drawing Sheets

WIRELESS TESTING SYSTEM AND METHOD FOR CONTROLLING THE SAME

CROSS-REFERENCE TO RELATED APPLICATION

This application claims priority of Chinese application no. 201310071558.4, filed on Mar. 6, 2013, 2013.

BACKGROUND OF THE INVENTION

1. Field of the Invention

The present invention relates to a wireless testing system and a method for controlling the same.

2. Description of the Related Art

Electronic devices (such as notebook computers, tablet computers and television sets) usually have wireless modules, such as Wi-Fi, Zigbee, Bluetooth, GPS, WiMax modules, etc., installed for operations and data transmissions. The wireless modules are usually controlled by control modules of the electronic devices and are incapable of independent operation. Therefore, the three dimensional radiation pattern measurements of the wireless modules are usually performed in the operating system after the electronic devices have been assembled. However, the original characteristics of the wireless modules cannot be precisely measured due to interferences from other electronic components in the electronic devices.

SUMMARY OF THE INVENTION

The object of the present invention is to provide a wireless testing system to be used with a room capable of electromagnetic radiation shielding for measuring a three dimensional radiation pattern of a wireless module that is placed in the room and that is incapable of independent operation.

Another object of the present invention is to provide methods for controlling the wireless testing system.

Accordingly, the wireless testing system of this invention includes a main computer, a rotary mechanism, a measurement device, and an antenna. The main computer is to be disposed outside the room and is to be electrically coupled with the wireless module. The main computer is configured to control the wireless module to transmit or receive a wireless signal. The rotary mechanism is to be disposed in the room. The rotary mechanism is coupled to the main computer and includes a rotatable seat having a first rotation axis extending in the direction of a third axis and controlled by the main computer to rotate about the first rotation axis, a support arm disposed on the rotatable seat and extending in the direction of the third axis, and a module rotating arm disposed on the support arm and spaced apart from the rotatable seat along the third axis. The module rotating arm is configured to position the wireless module at or in the vicinity of the first rotation axis, and has a second rotation axis extending in the direction of a first axis. The module rotating arm is controlled by the main computer to rotate the wireless module about the second rotation axis. The antenna is to be disposed in the room in a manner that the antenna is substantially directed toward the wireless module. The measurement device is to be disposed outside the room. The measurement device is coupled to the main computer and the antenna, and is controlled by the main computer to control the antenna to receive or transmit the wireless signal.

According to another aspect of the present invention, there is provided a method for controlling the wireless testing system. The wireless testing system includes a main computer and a measurement device that are disposed outside the room, and a rotary mechanism and an antenna that are disposed inside the room. The rotary mechanism includes a rotatable seat, a support arm disposed on the rotatable seat, and a module rotating arm disposed on the support arm and having the wireless module positioned thereon. The antenna is directed toward the wireless module on the module rotating arm and is coupled to the main computer via the measurement device and the main computer.

The method comprises the following steps:
(A) controlling the wireless module, using the main computer, to transmit a wireless signal, and subsequently receiving, by the main computer, the wireless signal via the antenna and the measurement device;
(B) controlling the module rotating arm, using the main computer, to rotate the wireless module a second predetermined angle about a second rotation axis of the module rotating arm;
(C) repeating steps (A) and (B) until an accumulated angular rotation of the wireless module corresponds to a predetermined second angle limit;
(D) controlling the rotatable seat, using the main computer, to rotate the rotatable seat a first predetermined angle about a first rotation axis of the rotatable seat; and
(E) repeating steps (A) to (D) until an accumulated angle of rotation of the rotatable seat corresponds to a predetermined first angle limit.

According to a further aspect of the present invention, there is provided another method for controlling the wireless testing system. The wireless testing system includes a main computer and a measurement device that are disposed outside the room, and a rotary mechanism and an antenna that are disposed inside the room. The rotary mechanism includes a rotatable seat, a support arm disposed on the rotatable seat, and a module rotating arm disposed on the support arm and having the wireless module positioned thereon. The antenna is directed toward the wireless module on the module rotating arm and is coupled to the main computer via the measurement device and the main computer.

The method comprises the following steps:
(A) controlling the measurement device, using the main computer, to transmit a wireless signal via the antenna, and subsequently receiving, by the main computer, the wireless signal via the wireless module positioned on the module rotating arm;
(B) controlling the module rotating arm, using the main computer, to rotate the wireless module a second predetermined angle about a second rotation axis of the module rotating arm;
(C) repeating steps (A) and (B) until an accumulated angular rotation of the wireless module corresponds to a predetermined second angle limit;
(D) controlling the rotatable seat, using the main computer, to rotate the rotatable seat a first predetermined angle about a first rotation axis of the rotatable seat; and
(E) repeating steps (A) to (D) until an accumulated angle of rotation of the rotatable seat corresponds to a predetermined first angle limit.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
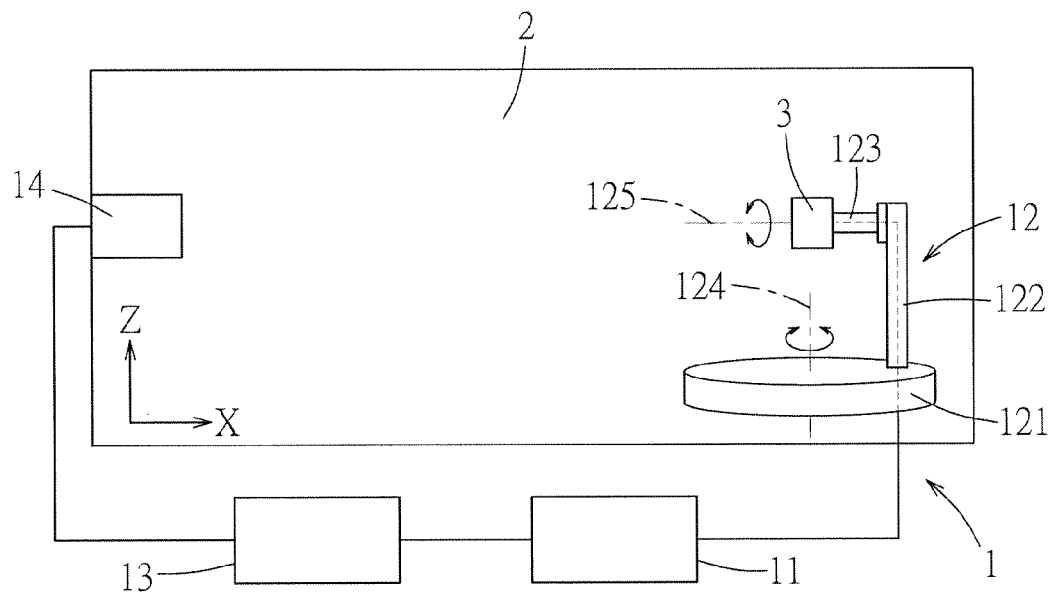
FIG. 1 is a schematic side view of a wireless testing system of the first embodiment of the present invention.
Figure 2:
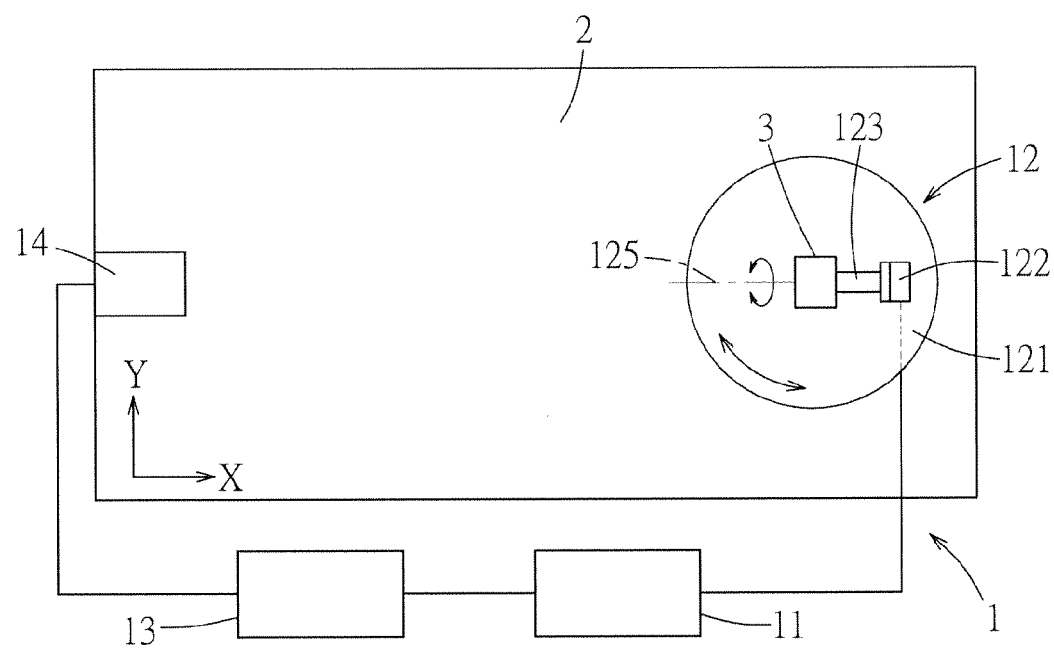
FIG. 2 is a schematic top view of the wireless testing system of the first embodiment of the present invention.

Referring to FIGS. 1 and 2, the wireless testing system 1 of the first preferred embodiment of the present invention includes a main computer 11, a rotary mechanism 12, a measurement device 13 and an antenna 14. The wireless testing system 1 to be used with a room 2 capable of electromagnetic radiation shielding for measuring a three dimensional radiation pattern of a wireless module 3 that is placed inside the room 2 and that is incapable of independent operation. The wireless module 3 can be a type of communication module, such as Wi-Fi, Zigbee, Bluetooth, GPS, WiMax, etc.

The main computer 11 is disposed outside the room 2, and is electrically coupled with and controls the wireless module 3, the rotary mechanism 12 and the measurement device 13.

The rotary mechanism 12 is disposed in the room 2, and includes a rotatable seat 121, a support arm 122 and a module rotating arm 123. The rotatable seat 121 has a first rotation axis 124 extending in a direction of the third axis and is controlled by the main computer to rotate on a first plane (i.e., an X-Y plane of the three dimensional coordinate system of the room 2) about the first rotation axis 124. The support arm 122 is disposed on the rotatable seat 121 and extends in the direction of the third axis. The module rotating arm 123 is disposed on the support arm 122 and is spaced apart from the rotatable seat 121 along the third axis. The module rotating arm 123 is configured to position the wireless module 3 at or in the vicinity of the first rotation axis 124 of the rotatable seat 121, and is configured to position the wireless module 3 at the first rotation axis 124 in this embodiment. The module rotating arm 123 has a second axis 125 extending in the direction of a first axis (i.e., an X-axis of the three dimensional coordinate system of the room 2), and is controlled by the main computer 11 to rotate the wireless module 3 about the second rotation axis 125.

The measurement device 13 is disposed outside the room and is coupled to and control led by the main computer 11. The measurement device 13 is controlled by the main computer 11 to control the antenna 14 to receive or transmit a wireless signal. In this preferred embodiment, the measurement device 13 is a wireless testing equipment that is connected with the antenna 14 via a horizontal polarity signal cable and a vertical polarity signal cable (both are not shown in the Figures) and that is connected with the main computer 11 via an interface cable. However, in other embodiments, the measurement device 13 can be a golden sample of the wireless module certified by a strict industry standard. With a different connection to the antenna 14 and the main computer 11, the golden sample of the wireless module 3 is able to function in the same manner as the wireless testing equipment. Specifically, when using the golden sample instead of the measurement device 13, the golden sample has to be respectively connected to the horizontal polarity signal cable and the vertical polarity signal cable via a programmable attenuator, which has to be connected to the main computer 11 through a General Purpose Interface Bus connecting wire, in order to enable control by the main computer 11. Therefore, the implementation of the measurement device 13 can be modified according to need, and is not limited to the disclosure of this embodiment.

The antenna 14 is disposed in the room in a manner that the antenna 14 and the wireless module 3 are disposed on a second plane (i.e., another X-Y plane) substantially parallel to the first plane and that the antenna 14 is substantially directed toward the wireless module 3. The antenna 14 is controlled by the measurement device 13 to receive or transmit the wireless signal. While the antenna 14 in this preferred embodiment is a horn antenna, it is not limited to such.

It is worth mentioning that "positioning the wireless module 3 at or in the vicinity of the first rotation axis", "the antenna 14 and the wireless module 3 being disposed on a second plane substantially parallel to the first plane", and "the antenna 14 being substantially directed toward the wireless module 3" means that the positions or the relative positions of the above-mentioned components can be slightly adjusted according to need.

Figure 3:
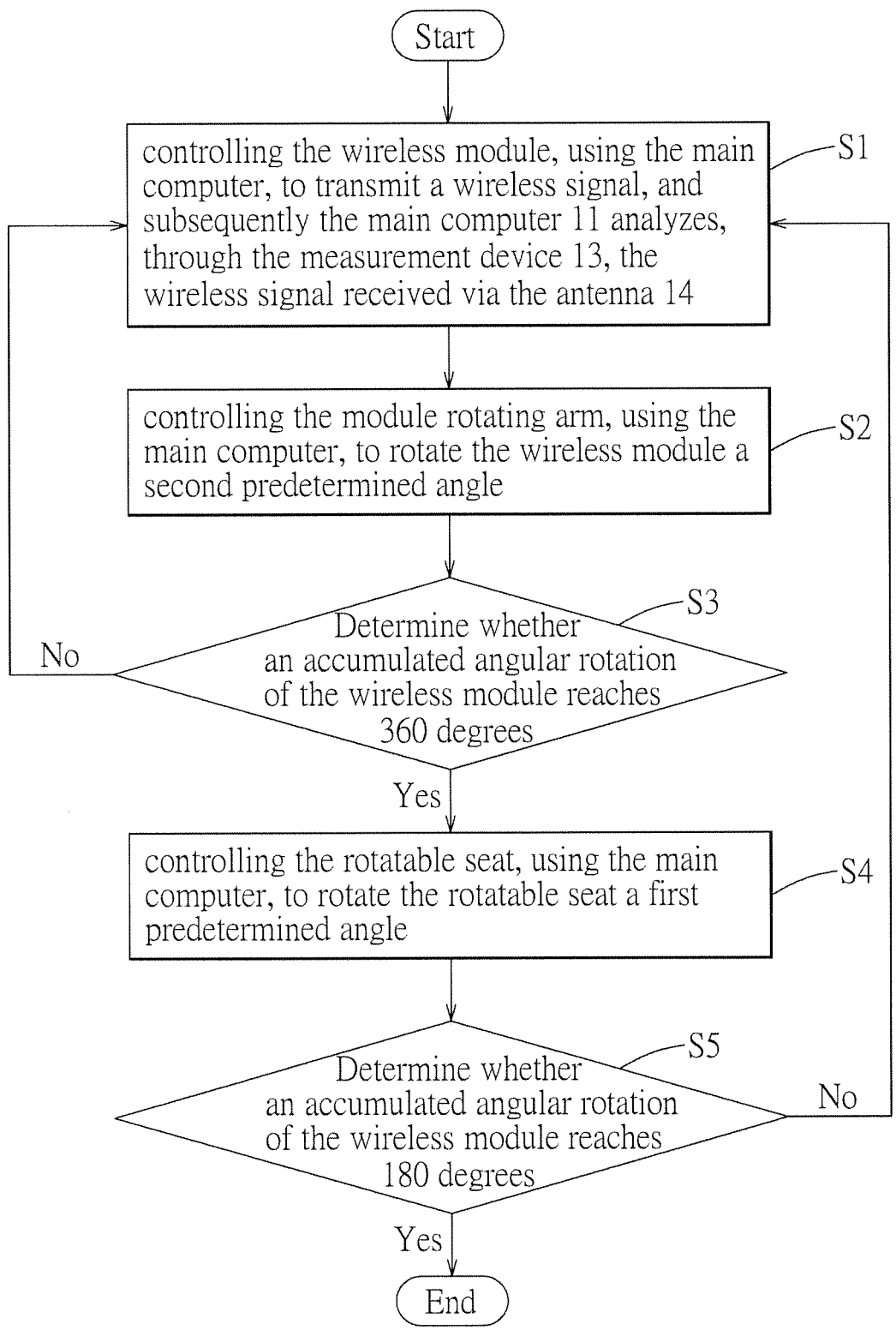
FIGS. 3 and 4 are flow charts illustrating steps in a method for controlling the wireless testing system.

Referring to FIGS. 1 to 3, a method for controlling the wireless testing system 1 to measure a three dimensional radiation pattern of the wireless module 3 includes the steps of:

Step S1: controlling the wireless module 3, using the main computer 11, to set power and frequency of the wireless signal and to transmit the wireless signal. Subsequently the main computer 11 analyzes, through the measurement device 13, the wireless signal received via the antenna 14, and makes a record of the analysis result.

Step S2: controlling the module rotating arm 123, using the main computer 11, to rotate the wireless module 3 a second predetermined angle about the second rotation axis 125 of the module rotating arm 123.

Step S3: repeating steps S1 and S2 until an accumulated angular rotation of the wireless module 3 corresponds to a predetermined second angle limit (such as 360 degrees in this embodiment).

Step S4: controlling the rotatable seat 121, using the main computer 11, to rotate the rotatable seat 121 a first predetermined angle about the first rotation axis 124 of the rotatable seat 121.

Step S5: repeating steps S1 to S4 until an accumulated angle of rotation of the rotatable seat 121 corresponds to a predetermined first angle limit (such as 180 degrees in this embodiment).

According to the above-mentioned method, users can define, using the main computer 11, the settings of the wireless signal of the wireless module 3, and progressively collect and record the measurements of the radiation power as the wireless module 3 is being rotated to different positions in the three dimensional space. After the measurement is completed, the main computer 11 can compute for the three dimensional radiation pattern of a total radiation power of the wireless module 3. Furthermore, the steps in the above-mentioned method can be completed automatically without user intervention, and therefore the user can conveniently check for the final result at the end of the process.

Figure 4:
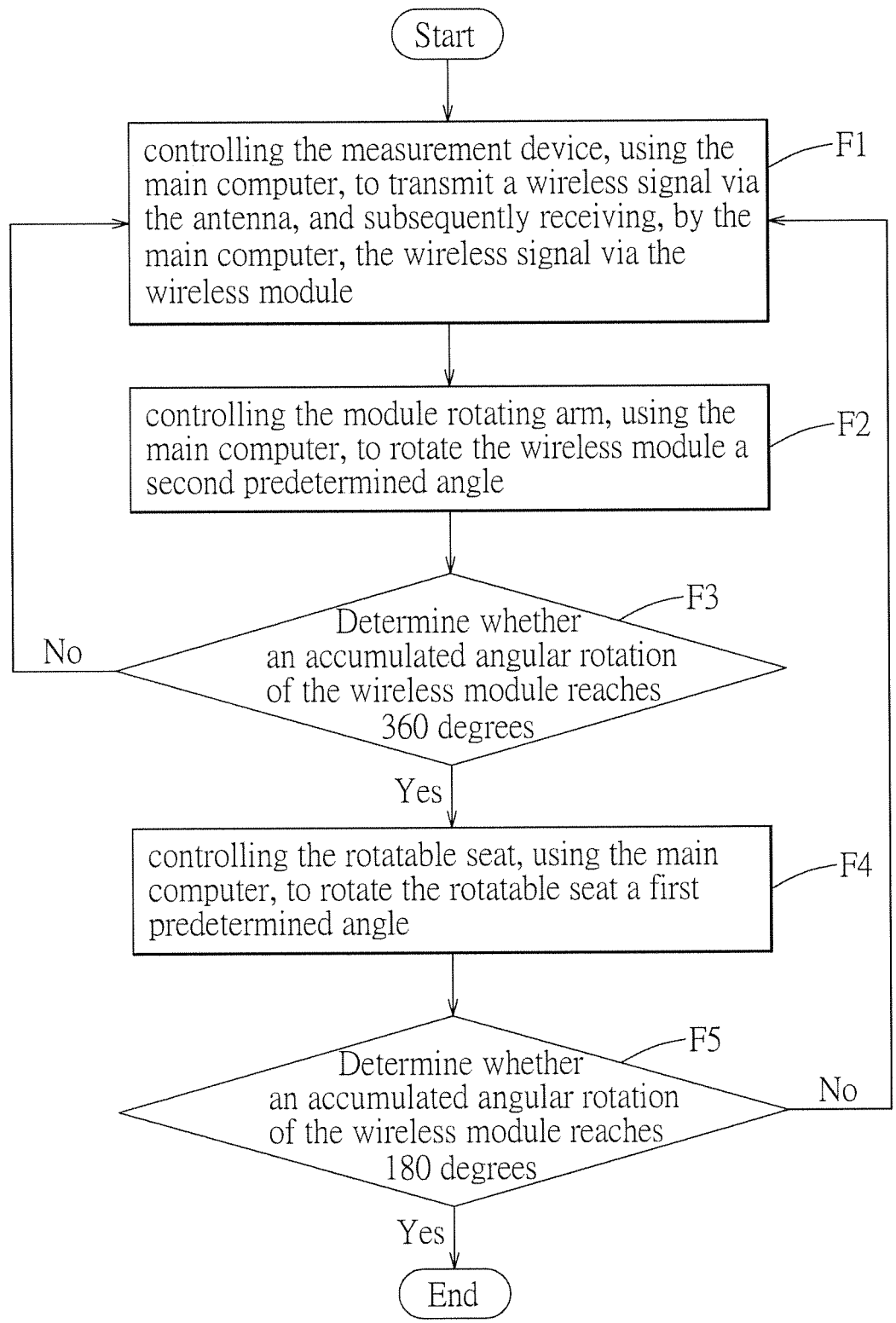

Referring to FIGS. 1, 2 and 4, a method for controlling the wireless testing system 1 to measure a total isotropic sensitivity (TIS) of the wireless module 3 includes the steps of:

Step F1: controlling the measurement device 13, using the main computer 11, to adjust the settings of a wireless signal (power, frequency and number of packets), and to transmit the wireless signal according to these settings via the antenna 14. Subsequently, the main computer 11 analyzes the wireless signal that is received via the wireless module 3, and accordingly adjusts the settings of the next wireless signal to be transmitted. The settings of the wireless signal in the measurement device 13 are adjusted until the isotropic sensitivity of the wireless module 3 at the particular position is detected.

Step F2: controlling the module rotating arm 123, using the main computer 11, to rotate the wireless module 3 a second predetermined angle about the second rotation axis 125 of the module rotating arm 123.

Step F3: repeating steps F1 and F2 until an accumulated angular rotation of the wireless module 3 corresponds to a predetermined second angle limit (such as 360 degrees in this embodiment).

Step F4: controlling the rotatable seat 121, using the main computer 11, to rotate the rotatable seat 121 a first predetermined angle about the first rotation axis 124 of the rotatable seat 121.

Step F5: repeating steps S1 to S4 until an accumulated angle of rotation of the rotatable seat 121 corresponds to a predetermined first angle limit (such as 180 degrees in this embodiment).

According to the above-mentioned method, users can, using the main computer 11, define the settings of the wireless signal of the measurement device 13 and control the procedure of the above-mentioned steps for measuring the isotropic sensitivity of the wireless module 3 in different positions. After the measurement is completed, the main computer can compute for the three dimensional radiation pattern of the total isotropic sensitivity of the wireless module 3.

In Step F1 of this preferred embodiment, a common standard is used to determine the isotropic sensitivity of the wireless module 3 in a specific position, i.e., the wireless module 3 can receive at least 90% of the packets transmitted that corresponds to a wireless energy threshold. However, the standard for determining the isotropic sensitivity can be modified according to needs.

Furthermore, steps S1-S5 and steps F1-F5 can be executed after each other, and do not have to be executed separately, in order for the measurement of the TRP and TIS of the wireless module 3 to be completed in one cycle. Moreover, characteristics other than the TRP and TIS may also be measured by the wireless testing system 1.

Figure 5:
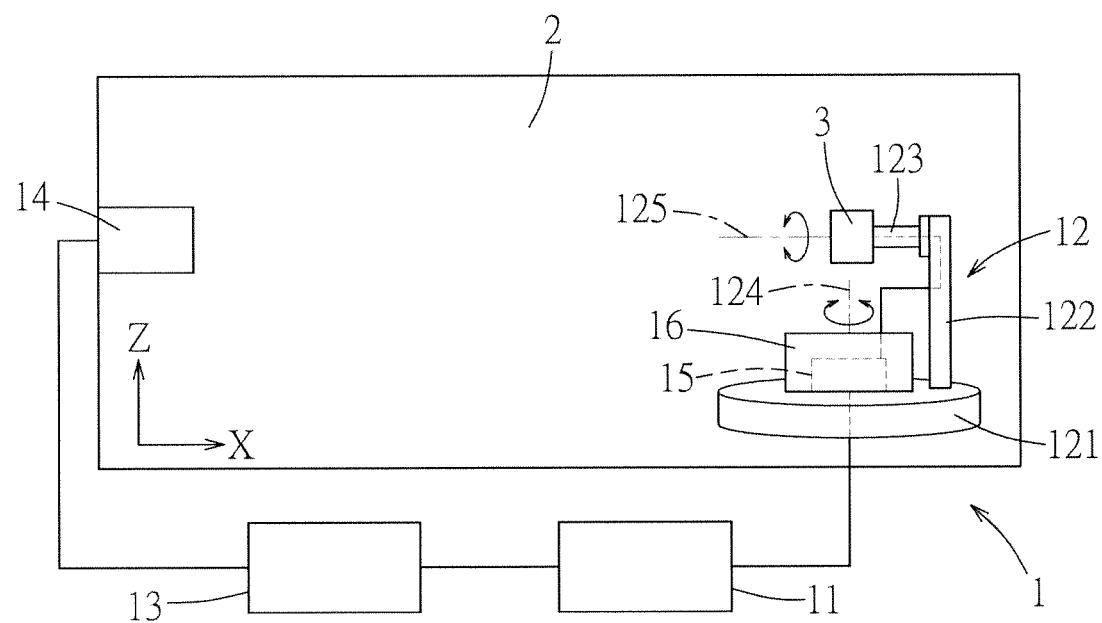
FIG. 5 is a schematic side view of the wireless testing system of a second embodiment of the present invention.

FIG. 5 illustrates the second preferred embodiment of the wireless testing system 1 of this invention, which is similar to the first preferred embodiment. The difference is that the wireless testing system 1 of the second preferred embodiment further includes a remote computer 15 to be disposed in the room 2, and a shield box 16.

When the length of the cable (such as USB, PCI-E etc.) is insufficiently long, the remote computer 15 can be disposed to couple electrically the main computer 11 to the wireless module 3, and the remote computer 15 is controlled by the main computer 11 to control the wireless module 3 to transmit or receive the wireless signal. The shield box 16 contains the remote computer to shield electromagnetic radiation (such as attaching materials that absorb electromagnetic radiation on the surface of the shield box 16) from the remote computer 15. By connecting the wireless module 3 and the remote computer 15 with the USB or PCI-E cable, and the remote computer 15 and the main computer 11 with an Ethernet cable, the problem of insufficient cable length can be effectively solved.

In summary, the present invent ion provides a wireless testing system 1 for measurement on a wireless module 3 that is incapable of independent operation, and a method for controlling the wireless testing system 1 to perform such measurement. By virtue of the present measurement on the original characteristics of the wireless module 3 via the main computer 11 that sets and controls the wireless module 3, the rotary mechanism 12 and the measurement device 13, thereby effectively reducing the time needed for measuring the three dimensional radiation pattern of the wireless module 3.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

What is claimed is:

1. A wireless testing system to be used with a room capable of electromagnetic radiation shielding for measuring a three dimensional radiation pattern of a wireless module that is placed in the room and that operates dependently, the room having a Cartesian coordinate in three dimensions consisting of a first axis, a second axis and a third axis that are mutually orthogonal, the wireless testing system comprising:
   a main computer disposed outside the room and electrically coupled with the wireless module, the main computer being configured to control the wireless module to transmit or receive a wireless signal;
   a rotary mechanism disposed in the room, said rotary mechanism being controlled by said main computer and including:
      a rotatable seat having a first rotation axis extending in the direction of the third axis and controlled by the main computer to rotate about the first rotation axis,
      a support arm disposed on the rotatable seat and extending in the direction of the third axis, and
      a module rotating arm disposed on the support arm and spaced apart from the rotatable seat, the module rotating arm being configured to hold the wireless module and position the wireless module at or in the vicinity of the first rotation axis, and having a second rotation axis extending in the direction of the first axis, the module rotating arm being controlled by the main computer to rotate the wireless module about the second rotation axis;
   an antenna disposed in the room in a manner that the antenna is substantially directed toward the wireless module;
   a measurement device disposed outside the room, the measurement device being coupled to the main computer and the antenna, and being controlled by the main computer to control the antenna to receive or transmit the wireless signal;
   a remote computer disposed in the room, the remote computer being electrically coupled with the main computer and with the wireless module, and being controlled by the main computer to control the wireless module to transmit or receive the wireless signal; and
   a shield box disposed in the room to contain the remote computer therein and for shielding electromagnetic radiation from the remote computer.

2. The wireless testing system as claimed in claim 1, wherein the rotatable seat is controlled by the main computer to rotate on a first plane about the first rotation axis, and the antenna and the wireless module are disposed on a second plane substantially parallel to the first plane.

3. The wireless testing system as claimed in claim 1, wherein the measurement device is one of a wireless testing equipment and a golden sample of the wireless module.

4. The wireless testing system as claimed in claim 1, wherein the measurement device is one of a wireless testing equipment and a golden sample of the wireless module.

5. A method for controlling a wireless testing system to measure a three dimensional radiation pattern of a wireless module that operates dependently and that is placed in a room capable of electromagnetic radiation shielding, the wireless testing system including a main computer and a measurement device that are disposed outside the room, a rotary mechanism and an antenna that are disposed inside the room, and a remote computer that is disposed in the room and that is contained in a shield box for shielding electromagnetic radiation from the remote computer, the rotary mechanism being controlled by the main computer and including a rotatable seat, a support arm disposed on the rotatable seat, and a module rotating arm disposed on the support arm and having the wireless module positioned thereon, the antenna being directed toward the wireless module on the module rotating arm and being coupled to the main computer via the measurement device and the main computer, the method comprising:

(A) controlling the remote computer, using the main computer, to control the wireless module to transmit a wireless signal, and subsequently receiving, by the main computer, the wireless signal via the antenna and the measurement device;

(B) controlling the module rotating arm, using the main computer, to rotate the wireless module a second predetermined angle about a second rotation axis of the module rotating arm;

(C) repeating steps (A) and (B) until an accumulated angular rotation of the wireless module corresponds to a predetermined second angle limit;

(D) controlling the rotatable seat, using the main computer, to rotate the rotatable seat a first predetermined angle about a first rotation axis of the rotatable seat; and (E) repeating steps (A) to (D) until an accumulated angle of rotation of the rotatable seat corresponds to a predetermined first angle limit.

6. The method as claimed in claim 5, wherein, in step (A), power and frequency of the wireless signal transmitted by the wireless module are set using the main computer.

7. The method as claimed in claim 6, wherein the measurement device is one of a wireless testing equipment and a golden sample of the wireless module.

8. The method as claimed in claim 5, wherein the measurement device is one of a wireless testing equipment and a golden sample of the wireless module.

9. A method for controlling a wireless testing system to measure a three dimensional radiation pattern of a wireless module that operates dependently and that is placed in a room capable of electromagnetic radiation shielding, the wireless testing system including a main computer and a measurement device that are disposed outside the room, a rotary mechanism and an antenna that are disposed inside the room, and a remote computer that is disposed in the room and that is contained in a shield box for shielding electromagnetic radiation from the remote computer, the rotary mechanism being controlled by the main computer and including a rotatable seat, a support arm disposed on the rotatable seat, and a module rotating arm disposed on the support arm and having the wireless module positioned thereon, the antenna being directed toward the wireless module on the module rotating arm and being coupled to the main computer via the measurement device and the main computer, the method comprising the following steps:

(A) controlling the measurement device, using the main computer, to transmit a wireless signal via the antenna, and subsequently controlling the remote computer, by the main computer, to control the wireless module to receive the wireless signal;

(B) controlling the module rotating arm, using the main computer, to rotate the wireless module a second predetermined angle about a second rotation axis of the module rotating arm;

(C) repeating steps (A) and (B) until an accumulated angular rotation of the wireless module corresponds to a predetermined second angle limit;

(D) controlling the rotatable seat, using the main computer, to rotate the rotatable seat a first predetermined angle about a first rotation axis of the rotatable seat; and (E) repeating steps (A) to (D) until an accumulated angle of rotation of the rotatable seat corresponds to a predetermined first angle limit.

10. The method as claimed in claim 9, wherein, in step (A), frequency, power and number of packets of the wireless signal transmitted via the antenna are set using the main computer.

11. The method as claimed in claim 9, wherein the measurement device is one of a wireless testing equipment and a golden sample of the wireless module.

12. The method as claimed in claim 9, wherein the measurement device is one of a wireless testing equipment and a golden sample of the wireless module.

* * * * *